United States Patent [19]

Tousignant

[11] Patent Number: 5,411,077
[45] Date of Patent: May 2, 1995

[54] FLEXIBLE THERMAL TRANSFER APPARATUS FOR COOLING ELECTRONIC COMPONENTS

[75] Inventor: Lew A. Tousignant, Shoreview, Minn.

[73] Assignee: Minnesota Mining and Manufacturing Company, St. Paul, Minn.

[21] Appl. No.: 226,272

[22] Filed: Apr. 11, 1994

[51] Int. Cl.$^6$ .......................................... H01L 23/473
[52] U.S. Cl. ................................. 165/104.33; 165/46
[58] Field of Search ........................ 165/46, 104.33

[56] References Cited

U.S. PATENT DOCUMENTS

| | | | |
|---|---|---|---|
| 3,256,703 | 6/1966 | Selwitz | 165/104.33 |
| 3,496,995 | 2/1970 | Rosen et al. | 165/46 |
| 3,741,292 | 6/1973 | AAkalu et al. | 165/105 |
| 3,826,957 | 7/1974 | McLaughlin et al. | 317/234 |
| 4,092,697 | 12/1976 | Spaight | 361/386 |
| 4,109,707 | 8/1978 | Wilson et al. | 165/46 |
| 4,155,402 | 5/1979 | Just | 165/46 |
| 4,296,796 | 10/1981 | Wulf | 165/46 |
| 4,381,032 | 4/1983 | Cutchaw | 165/46 |
| 4,563,375 | 8/1984 | Ulrich . | |
| 4,646,815 | 3/1987 | Iwata et al. . | |
| 4,938,279 | 7/1990 | Betker | 165/46 |
| 4,951,740 | 8/1990 | Peterson et al. | 165/32 |
| 4,997,032 | 3/1991 | Danielson | 165/46 |
| 5,000,256 | 3/1991 | Tousignant | 165/46 |
| 5,046,552 | 9/1991 | Tousignant | 165/46 |
| 5,168,921 | 12/1992 | Meyer | 165/140.14 |
| 5,205,348 | 4/1993 | Tousignant . | |
| 5,249,358 | 10/1993 | Tousignant . | |

FOREIGN PATENT DOCUMENTS 75381  8/1993  Australia .
18159  1/1986  Japan .

OTHER PUBLICATIONS

*Chip-Cooling Apparatus With Flexible Material Separating Cooling Fluid From Chip And With Metal Plate Contacting Chip And Attached To Flexible Material By Studs Extending Into Cooling Fluid*, IBM Technical Disclosure Bulletin, vol. 28, No. 3 (Aug. 1985).
*Liquid Cooling Flows To Desktop PC's*, Electronic Engineering Times, pp. 1, 10 and 128.
Danielson et al., *Cooling a Superfast Computer*, Elec. Packaging & Prod., pp. 44–45 (Jul. 1986).
*Liquid Heat Sink Cools Quietly, Takes Little Space*, Elec. Prods. (Apr. 15, 1988).
*Thermal-Management Products, Circuit Design Requires Thermal Expertise*, EDN, pp. 93–104 (Jun. 22, 1989).

(List continued on next page.)

Primary Examiner—A. Michael Chambers
Attorney, Agent, or Firm—Kinney & Lange

[57] ABSTRACT

A thermal transfer apparatus adapted for thermal connection to a heat source for conducting heat away from the heat source. The thermal transfer apparatus includes a container which is substantially impermeable to fluid and forms an expandable compartment that is substantially gas-free. A thermal transfer liquid is positioned within the expandable compartment for thermal connection to the heat source. The thermal transfer liquid has a boiling point that is at or below an operating temperature of the heat source. When the heat source is in a non-operating state, the thermal transfer liquid is compressed and substantially fills the expandable compartment. When the heat source is in an operating state, the thermal transfer liquid conducts heat from the heat source. The liquid vaporizes and forms a vapor within the expandable compartment which causes the expandable compartment to expand and create a vapor space above the liquid. A condenser condenses the vapor into a condensate at a location remote from the heat source. The condensate then returns to the body of liquid for additional cooling of the heat source.

25 Claims, 5 Drawing Sheets

OTHER PUBLICATIONS

Wall, *Thermal Management of a Microcomputer Using a Liquid Heat Sink*, Elec. Mfg., pp. 19–20 (Jun. 1989).
*Liquid Heat Sink Cools Microcomputer*, Design Ideas, pp. 208–209 (Sep. 4, 1989).
Parsapour, *Convection Cooling in Small Terminals*, IBM Technical Disclosure Bulletin, vol. 24, No. 2 (Jul. 1981).
Hultmark et al., *Thermal Enhancement of Modules*, IBM Technical Disclosure Bulletin, vol. 19, No. 8 (Jan. 1977).
*3M Canada Inc., Commercial Chemical Division, Fuorinert Liquid Heat Sink–Second Runner–Up, Best Component, Canadian High Technology Show Oct. 17 and 18, 1989*, Canadian Elec. Eng., p. 12 (Dec. 1989).
*13th Annual Product of the Year Awards–Liquid Heat Sink Comes in a Pouch*, Elec. Prods., pp. 27–32 and 36 (Jan. 1989).
Ept Electronic Products and Technology, pp. 1–3, 42 and 43 (Nov. 1989).

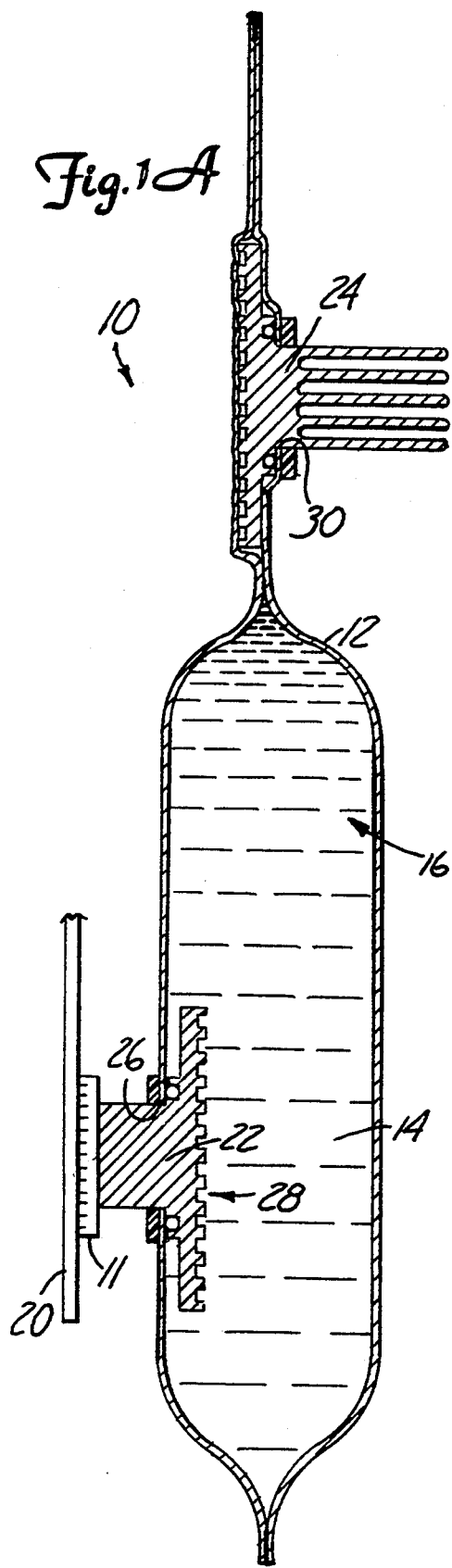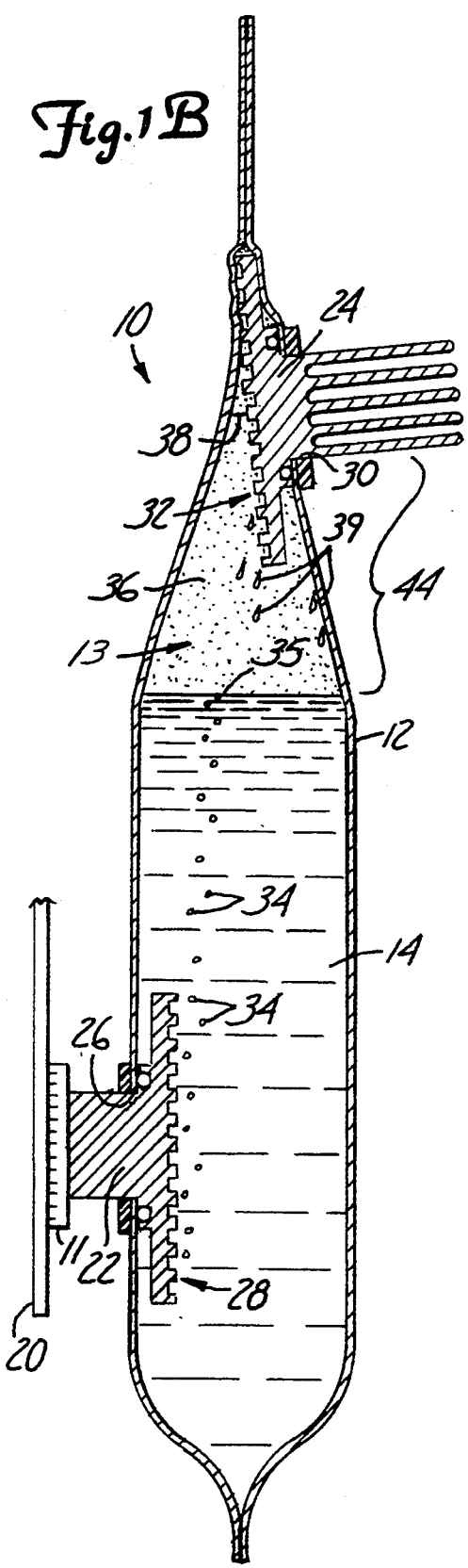

FLEXIBLE THERMAL TRANSFER APPARATUS FOR COOLING ELECTRONIC COMPONENTS

BACKGROUND OF THE INVENTION

The present invention relates to a flexible thermal transfer apparatus for cooling electronic components. In particular, the present invention relates to a two-phase, flexible thermal transfer bag containing a low boiling point thermal transfer liquid which vaporizes and then condenses in response to heat flux from a heat source.

As electronic systems become more compact, various auxiliary heat transfer techniques have been proposed to satisfy a need for increased system cooling. Heat transfer techniques have conventionally employed fans, heat sinks or both. Fans dissipate thermal energy from components by forced air convection. Passive heat sinks dissipate thermal energy by natural air convection.

With conventional heat transfer techniques, it is sometimes difficult to provide sufficient cooling for components within compact or densely arranged electronic systems. Forced air convection methods have practical limits because the amount of air required to provide sufficient cooling generally creates an unacceptable level of noise. Also, forced air convection methods have difficulty maintaining a large number of electronic components within critical, narrow operating temperature ranges. Passive heat sinks require a specified volume which may be difficult to provide within compact or densely arranged electronic systems.

In a circulating liquid cooling system, the circulating liquid is in thermal communication with the heat source and transfers heat to a remote heat sink, such as a chilled water supply, a refrigeration system or a liquid-to-air heat exchanger. Although these systems may be effective where passive or forced air convection techniques are insufficient, these systems are often complex, expensive and can significantly add to the overall system size.

In large scale electronic systems like super-computers or avionics systems, liquid immersion heat transfer techniques have been employed using a fluorocarbon liquid as the cooling medium. For example, Danielson et al., *Cooling a Superfast Computer*, Elec. Packaging and Prod. pp. 44–45 (July 1986) discloses a method of cooling a supercomputer, the Cray-2 TM, by immersing the computer, power supplies, memory board, logic circuits and main processors in a sealed bank of circulating inert, high-dielectric, perfluorocarbon, Fluorinert ® electronic liquid FC-77.

Another liquid immersion heat transfer technique is described in U.S. Pat. No. 3,741,292 (Aakalu et al.) In this technique, a rigid container is mounted to a substrate having a plurality of microelectronic components to be cooled. The container encloses the heat generating components and includes a sufficient volume of low boiling point, dielectric liquid to partially fill the container and immerse the components. The container further includes a vapor space located above the liquid. A plurality of internal fins extend inward into the vapor space, which serve as a condenser for the dielectric vapors. A plurality of external fins extend outward from the container, which serve as an air-cooled heat sink for the internal fin condenser. Aakalu et al. suggest the low boiling point dielectric liquid can include one of the fluorocarbon liquids FC-78 or FC-88. Aakalu et al. suggest that since the container is sealed, a binary mixture of fluids having different characteristics can be selected to give the minimum amount of pressure buildup in the container.

As described in the Aakalu '292 patent, the low boiling point dielectric fluorocarbon liquids give rise to various types of boiling at relatively low temperature. The mode of boiling and the resulting heat transfer are dependent on the heat flux at the interface between the component to be cooled and the coolant liquid. For a small heat flux that results in a temperature below the boiling point of the liquid, natural convection takes place. As the heat flux increases, the temperature increases beyond the boiling point of the liquid which causes nucleate boiling. Nucleate boiling causes the liquid to vaporize immediately adjacent the heat source. As vapor bubbles form and grow on the heated surface, they cause intense microconvection currents and remove heat by the latent heat of vaporization of the liquid. Thus, nucleate boiling increases convection within the liquid and improves heat transfer between the heat source and the liquid. The system disclosed by Aakalu et al. operates similar to a rigid heat pipe.

A disadvantage of the rigid container disclosed in the Aakalu et al. '292 patent and of rigid heat pipes in general is that the boiling point of the heat transfer liquid in the container varies with the internal pressure of the container. As the power dissipated from the heat generating component increases, the heat flux from the component increases which increases vaporization. Since the container has fixed, rigid walls, the internal pressure of the container increases which causes the boiling point of the heat transfer liquid to increase. As a result, the operating temperature of the component increases with the internal pressure of the container. Another disadvantage of fixed, rigid containers and of heat pipes in general is that they consume a substantial amount of space and are relatively heavy.

A recent development which efficiently transfers heat in compact electronic systems is a Liquid Heat Sink TM thermal transfer bag available from Minnesota Mining and Manufacturing Company, assignee of the present invention. The thermal transfer bag is made of a sheet of flexible, durable, air-impermeable material. The bag is filled with a thermally conductive, chemically inert, essentially gas-free fluorochemical liquid. The bag is placed within an internal cavity of the electronic system, between a surface of a heat generating component and a heat dissipating surface. Conduction through the liquid as well as some movement of liquid within the bag due to convection currents transfer heat from the heat generating component to the heat dissipating surface. The liquid has a boiling point which is high enough that the liquid will not boil at the highest operating temperature of the heat generating component.

The thermal transfer bag readily conforms to the internal cavity and comes into intimate contact with the heat generating component and the heat dissipating surface. The thermal transfer bag does not require additional battery power to cool the heat generating components. In some applications, the inherent shock-absorbing nature of the filled bag protects the components from physical shock. The bag can easily be removed and replaced in the field during repair, and may optionally be provided with an adhesive to hold the bag in place. U.S. Pat. No. 4,997,032 (Danielson et al.) describes the thermal transfer bag in greater detail.

U.S. Pat. No. 5,000,256 (Tousignant) discloses a thermal transfer bag having a metallic thermal via. The metallic thermal via extends through an aperture in the bag for contact with an external heat generating component. A portion of the via extends into the bag and functions as a heat radiating fin to enhance heat transfer from the heat generating component to the liquid within the bag.

U.S. Pat. No. 5,046,552 (Tousignant) discloses a heat transfer apparatus having a frame with a channel for the flow of heat transfer liquid. The apparatus further includes a flexible sheet connected to the frame and a thermal via coupled to the sheet. As fluid flows through the channel, the sheet and via move outwardly and contact the component to be cooled. A cover structure extends across the frame adjacent the via and limits outward movement of the sheet. The cover structure also prevents damage to the sheet when the apparatus is handled.

Australian Patent No. 75381/91 discloses a heat pipe in the form of a panel comprising an enclosed chamber having opposing, generally planar, parallel wall portions. The chamber is filled with a liquid and a vapor of the liquid, with the liquid and the vapor being in equilibrium. When one of the wall portions is heated, the vapor transfers heat from the wall portion being heated to the other wall portion where the vapor condenses. Both walls portions may be rigid or flexible. The chamber is also filled with particulate matter, such as glass beads, to prevent deformation when the vapor pressure is less than atmospheric or less than the surrounding atmosphere.

Other thermal transfer techniques have also been employed. U.S. Pat. No. 4,092,697 (Spaight) discloses cooling an integrated circuit package through a liquid contained in a film mounted on the underside of a cover enclosing the integrated circuit. The cover, film and liquid form a formable pillow such that when the cover is sealed to the package, the pillow contacts the top of the integrated circuits mounted within the package.

U.S. Pat. No. 4,155,402 (Just) discloses a means of packaging a printed circuit board. Circuit components are cooled by a liquid-cooled cold plate having a compliant mat interface. The interface is made of a film bonded to the underside of a liquid cold plate. Contained between the cold plate and the film is a paste such as thermal grease which can contain metal particles.

U.S. Pat. No. 4,563,375 (Ulrich) discloses a flat bag made of foils, such as aluminum, filled to only part of its maximum available volume with a thermally conductive paste without the presence of gas. The bag is disposed between substantially planar surfaces or vertical slats as a means of heat transfer.

There is a continuing desire to increase the rate of heat transfer away from the heat generating components of an electrical device and to decrease the thermal resistance through the components and the heat sink. Increasing the rate of heat transfer becomes even more important in instances where the components produce relatively large amounts of heat or where there is a need to reduce the overall size of the device. By increasing the rate of heat transfer, heat generating components may be spaced closer together with other components while still enabling each component to function properly within a stable, desired temperature range of operation.

SUMMARY OF THE INVENTION

The present invention is a thermal transfer apparatus adapted for conducting heat from a heat source. The thermal transfer apparatus includes a container which is substantially impermeable to fluid and forms at least one expandable compartment which is expandable between a first volume and a second volume. A thermal transfer liquid is positioned within the expandable compartment for thermal connection to the heat source. The thermal transfer liquid has a boiling point that is at or below an operating temperature of the heat source such that the liquid is compressed when the heat source is in a non-operating state and is saturated when the heat source is in an operating state.

The thermal transfer apparatus of the present invention operates as a two-phase heat sink since it uses both the liquid and gaseous forms of the thermal transfer liquid. When the heat source is in the non-operating state, the thermal transfer liquid substantially fills the first volume of the expandable compartment. When the heat source is in the operating state, heat flux from the heat source causes the thermal transfer liquid to boil. The liquid vaporizes and forms a vapor which rises and causes the expandable compartment to expand from the first volume toward the second volume and create a vapor space above the thermal transfer liquid. The thermal transfer liquid and the vapor maintain a liquid-vapor equilibrium at approximately ambient pressure. The rising vapor carries heat away from the heat source to a remote, cooler location where the vapor condenses into a condensate. Gravity returns the condensate to the body of thermal transfer liquid for additional cooling of the heat source and for completing a cooling cycle.

The expandable compartment maintains the thermal transfer liquid at ambient pressure substantially independent of changes in heat flux from the heat source. Therefore, the boiling point of the thermal transfer liquid remains substantially constant such that the operating temperature of the heat source does not rise significantly above the boiling point of the liquid with increasing heat flux.

In one embodiment, the container includes a flexible bag made of a multi-layer thermoplastic film. The heat source can be positioned external to the flexible bag or internal to the flexible bag. If the heat source is positioned external to the bag, the bag itself can conduct heat from the heat source to the thermal transfer liquid or the bag can include a thermal via extending through an aperture in the bag. A first portion of the thermal via is positioned external to the bag for thermal connection to the heat source. A second portion of the thermal via is positioned within the bag and is submerged in the thermal transfer liquid for thermal communication with the liquid.

If the heat source is positioned internal to the bag, the bag can include communication and power leads extending from the heat source through an aperture in the bag, with the aperture being sealed about the leads. In this embodiment, the heat source is submerged in the thermal transfer liquid such that it is direct contact with the liquid.

In another embodiment, the thermal transfer apparatus further includes a condenser. The condenser increases the rate of vapor condensation and the rate of heat dissipation from the bag. The condenser has a condensing surface which is positioned at least partially within the vapor space of the expandable compartment and above the liquid. The condensing surface can include a plurality of fins or other surface irregularities which provide an extended condensing surface.

The condenser also has a heat dissipating surface positioned external to the bag, which is thermally connected to the condensing surface. As the vapor condenses on the condensing surface, the condenser conducts heat from the condensing surface to the heat dissipating surface where the heat is dissipated to the surrounding environment. The heat dissipating surface dissipates heat through natural or forced air convection.

In yet another embodiment, the thermal transfer apparatus includes a condenser which is positioned remote from the bag and is connected to the expandable compartment through one or more tubes. The vapor travels through the tubes to the condenser where the vapor condenses and forms a condensate. The condensate returns to the expandable compartment through the tubes for additional cooling of the heat source.

In one embodiment, the thermal transfer apparatus further includes a wick connected between the condenser and the liquid which assists in returning the condensate to the liquid. The wick allows greater flexibility in the design and use of the thermal transfer apparatus since gravity is no longer required to return the condensate to the liquid. For example, the wick may be used in low gravity space applications or in applications that require various orientations of the bag and condenser.

The thermal transfer apparatus of the present invention is particularly useful as a heat sink for microelectronic components. The thermal transfer apparatus draws no additional power from the system and is efficient enough to cool high-power integrated circuits such as the Pentium ™ microprocessor which is manufactured by Intel Corporation. The thermal transfer apparatus can simply be placed in the component housing, adjacent the integrated circuits that require cooling. The flexible nature of the bag allows the bag to conform to the interior of the housing and to act as a shock absorber for the integrated circuits. The thermal transfer apparatus of the present invention provides a low-profile, efficient liquid cooling technique that can be used in smaller systems such as desktop and notebook computers. The thermal transfer apparatus of the present invention maintains the integrated circuits at a stable operating temperature which does not vary with the heat flux dissipated from the circuits.

BRIEF DESCRIPTION OF THE DRAWINGS

FIGS. 1(a), 1(b) and 1(c) are cross sectional views of a two-phase thermal transfer apparatus in thermal communication with an exterior heat source which is in various states of operation, in accordance with the present invention.

DETAILED DESCRIPTION OF THE PREFERRED EMBODIMENTS

Figure 1C:
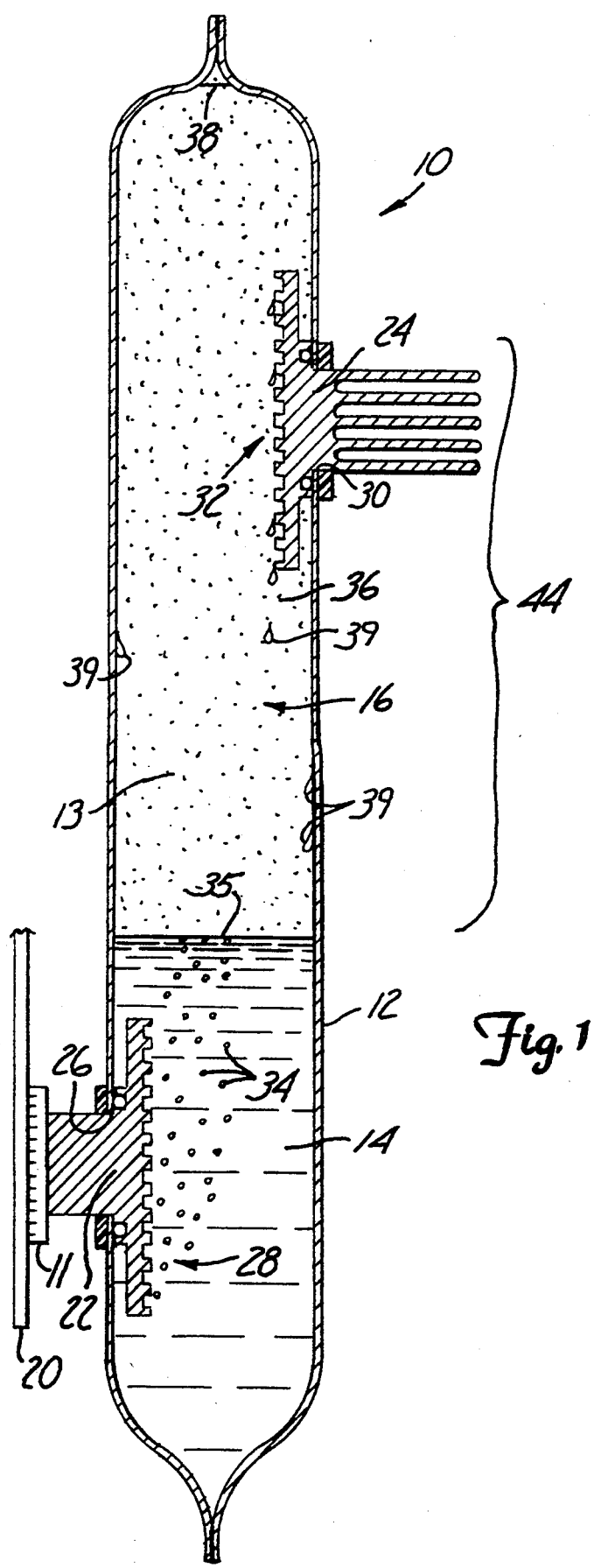

The present invention is a two-phase, flexible thermal transfer apparatus adapted for thermal connection to a heat source for conducting heat away from the heat source. FIGS. 1(a), 1(b), and 1(c) are cross sectional views of a two-phase, flexible thermal transfer apparatus 10 in communication with an external heat source 11 which is in various states of operation. FIG. 1(a) illustrates thermal transfer apparatus 10 when heat source 11 is in a non-operating state. FIGS. 1(b) and 1(c) illustrate thermal transfer apparatus 10 when heat source 11 is in an operating state. Thermal transfer apparatus 10 expands or "puffs-up" with increasing heat flux from heat source 11 and with an increasing volume of liquid vapor 13, as shown in the progression through FIGS. 1(a) to 1(c). Heat source 11 can be any electronic device or heat generating component, such as an integrated circuit mounted on a circuit board 20.

Thermal transfer apparatus 10 includes a flexible bag 12 containing a thermal transfer liquid 14. Flexible bag 12 is substantially impermeable to fluid and forms at least one expandable compartment 16. Compartment 16 is expandable between a first volume (FIG. 1(a)) and a second volume (FIG. 1(c)) in response to changes in heat flux from heat source 11. Heat source 11 is positioned external to compartment 16 and is in thermal communication with the thermal transfer liquid 14.

Thermal transfer apparatus 10 further includes a thermal via 22 and a condenser 24. Thermal via 22 extends through an aperture 26 in flexible bag 12 and has an extended heat dissipating surface 28. Thermal via 22 has a high thermal conductivity for conducting heat from heat source 11 to thermal transfer liquid 14. Thermal via 22 is optional in the present invention. In another embodiment (not shown), flexible bag 12 is in direct contact with heat source 11 and conducts heat through its side walls. However, thermal via 22 is preferred since it provides greater heat flux from heat source 11 to the thermal transfer liquid 14. Condenser 24 extends through an aperture 30 in flexible bag 12 and has an extended condensing surface 32. Condenser 24 is also optional but is preferred since it assists in dissipating heat to the surrounding environment.

Thermal transfer apparatus 10 operates as a two-phase heat sink since it uses both the liquid and gaseous forms of thermal transfer liquid 14. When heat source 11 is in the non-operating state (FIG. 1(a)), thermal transfer liquid 14 is compressed at ambient pressure and substantially fills the first volume of expandable compartment 16 such that expandable compartment 16 is essentially gas-free. A compressed liquid is a liquid that is below its boiling point at the existing pressure. Ambient pressure is the pressure of the environment in which thermal transfer apparatus 10 operates.

When heat source 11 is in the operating state (FIGS. 1(b) and 1(c)), heat flux from the heat source causes thermal transfer liquid 14 to become saturated and boil immediately adjacent the extended heat dissipating surface 28 of thermal via 22. The boiling liquid vaporizes and forms vapor bubbles 34 which rise and create a vapor space 36 above a liquid level 35. The rising vapor bubbles 34 carry heat away from heat source 11 to a remote, cooler location. Vapor space 36 has a vapor level 38. As vapor space 36 increases with increasing heat flux from heat source 11, vapor level 38 rises and causes expandable compartment 16 to expand or "puff up" from the first volume (FIG. 1(a)) toward the second volume (FIG. 1(c)). The vapor condenses into a condensate 39 on the interior surfaces of flexible bag 12 and on the extended condensing surface 32 of condenser 24. Gravity returns condensate 39 to thermal transfer liquid 14 for additional cooling of heat source 11 and to complete a cooling cycle. Vapor level 38 defines a vapor reflux zone 44 where the vapor condenses and returns to liquid 14. Flexible bag 12 and condenser 24 conduct heat carried by the vapor to the exterior of the bag where the heat is dissipated to the external environment.

Liquid 14 and the vapor maintain a liquid-vapor equilibrium at approximately ambient pressure within expandable compartment 16. Since bag 12 is flexible and has an expandable compartment, the liquid and vapor in the bag remain at approximately ambient pressure substantially independent of changes in heat flux from heat source 11. Therefore, the boiling point of thermal transfer liquid 14 remains substantially constant such that the operating temperature of heat source 11 does not rise significantly above the boiling point of the liquid with increasing heat flux from heat source 11.

Figure 2:
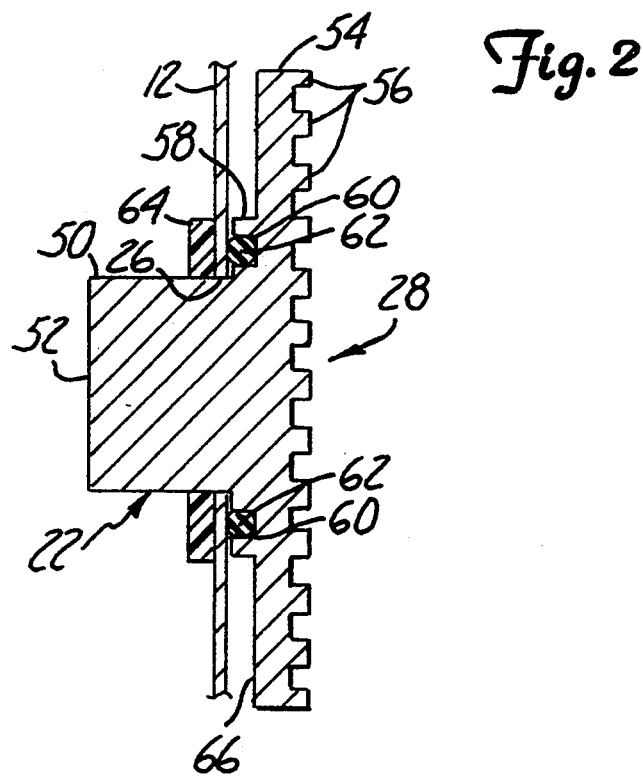
FIG. 2 is a cross sectional view of a thermal via in accordance with the present invention.

Thermal via 22 is shown in greater detail in FIG. 2. Thermal via 22 has a first cylindrical portion 50 which extends through aperture 26 in a direction away from flexible bag 12 and liquid 14. The first portion 50 has a planar top 52 for direct, abutting contact with a flat external surface of heat source 11. Since bag 12 is flexible, thermal via 22 will self-shift due to internal pressures or weight of thermal transfer apparatus 10 until top 52 of thermal via 22 is in flat, planar contact with heat source 11.

Thermal via 22 further includes a second cylindrical portion 54 which is remote from the first portion 50. Second portion 54 is connected to the first portion 50 and is located within flexible bag 12 such that the second portion 54 is submerged in thermal transfer liquid 14. Second portion 54 has an array of small stubs or fins 56 which provide the extended heat dissipating surface 28 for intimate contact and heat exchange with thermal transfer liquid 14. Fins 56 are optional.

Thermal via 22 has an intermediate cylindrical portion 58 located between the first portion 50 and the second portion 54. Intermediate portion 58 is coaxial with portions 50 and 54 and has a cylindrical shape having a diameter larger than the diameter of the first portion 50 and smaller than the diameter of the second portion 54. An annular groove 60 is formed on intermediate portion 58, which receives an O-ring 62.

An annular lock ring 64, together with O-ring 62, comprise a means for sealingly connecting thermal via 22 to flexible bag 12 in an area adjacent aperture 26. Lock ring 64 is flexible and has an inner diameter slightly smaller than the outer diameter of the first portion 50 in order to establish a self-sustaining, interference fit relationship when lock ring 64 is pressed over the first portion 50. During assembly, lock ring 64 presses bag 12 against O-ring 62 in order to seal thermal via 22 to bag 12. In one embodiment, lock ring 64 is made of a plastic material. Lock ring 64 includes threaded holes (not shown) for coupling lock ring 64 to a pressing tool for detaching the lock ring from thermal via 22 if maintenance or repair of apparatus 10 is desired.

The second portion 54 of thermal via 22 has a larger surface area than the exposed external surface area of the first portion 50, such that the second portion 54 functions as a heat-radiating body to quickly dissipate thermal energy conducted from heat source 11. Intermediate portion 58, being of smaller diameter than the second portion 54 serves as a stand-off in order to space the second portion 54 away from flexible bag 12 and thereby enable thermal transfer liquid 14 to contact a top wall 66 of the second portion 54 as well as the extended heat dissipating surface 28.

Thermal via 22 is made of a material, preferably aluminum, having a high thermal conductivity that may exceed the thermal conductivity of flexible bag 12. Thermal transfer apparatus 10 can also include multiple thermal vias, with each via being similar to via 22. With multiple vias, a single bag can be used to cool a number of electrical components, with each component simultaneously contacting a respective via. Thermal via 22 is described in greater detail in U.S. Pat. Nos. 5,046,552 (Tousignant) and in 5,000,256 (Tousignant), which are hereby incorporated by reference.

Flexible bag 12 can be made of a single or multi-layer plastic film. Thermal plastic films are preferred since they are readily available and many are heat sealable. If the film is of multi-layer construction, the layers or plies must be bonded so that they cannot be mechanically separated. The film can be chosen from the family of single or multi-layer films that have properties of durability, flexibility and low permeabilities to air and to the thermal transfer liquid 14. Multi-layer films are preferred because each film layer can contribute its best characteristics, like heat sealability or fluid impermeability, to the overall film characteristics while a particular film's weaknesses, such as low durability or air permeability, can be compensated for by other film layers.

A representative range of film durability can be described by a tensile strength, M. D. Break (as measured per ASTM D882 Method A) of 2.69 kgf/cm, by an elongation, M. D. Break (as measured per ASTM D882 Method A) of about 100% by an Elmendorf tear strength (as measured per ASTM D1922) of 32-no tear gin/ply, and by a Mullen burst strength range (as measured per ASTM D744) of 2.8–3.5 kgf/cm$^2$.

A representative range of film air-permeability can be expressed as oxygen permeability (as measured per ASTM D3985) of 0.4–7.0 cc/100 in$^2$/24 hr, at 760 torr.

A representative range of film permeability to thermally conductive liquid is 0–1 gram of bag weight lost after heating, per 100 grams of bag weight as measured before heating. Film permeability to thermally conductive liquid was measured by determining weight loss from a sealed bag filled with helium de-gassed Fluorinert ® FC-77 liquid after heating said bag in a horizontal position in an oven or like device held at 50° C., for 70 hours. The bag was 8.23±0.08 cm wide, and 12.06±0.08 cm long before filling with about 56 ml of FC-77 liquid. The liquid volume gave the sealed bag a thickness of 0.69±0.08 cm prior to heating the bag. In preparing the FC-77 liquid for filling the bag, helium gas was bubbled or sparged through the liquid at a rate of 250 cc/min for 20 minutes, at normal ambient conditions. After heating the bag in the oven it was cooled to room temperature before weighing. The liquid can also be de-gassed by boiling the liquid prior to sealing the bag.

Representative two-layer films are available from 3M Company as Scotchpak ® films described in product information sheets YZSP229(53.1)R1 published April 1983, (66.02)R2 published Jun. 2, 1983 and product information sheet "Heat Sealable Polyester Film 48" published Jul. 1, 1985.

Representative three-layer films are available from C & H Packaging Co., Merrill, Wis. One example of a three-layer film has a nominal $8.9 \times 10^{-3}$ cm (3.5 mil) thickness, has a heat-sealable layer of polyethylene-covinyl acetate about 2 mils thick, laminated by adhesive to a layer of polyvinylidene chloride bonded to a layer of about 1 rail of polyamide.

Pantry Pack No. 50 is another suitable film which is available from American National Can Company. The film includes a 0.48 mil layer of polyethylene terephthalate (PET) which is laminated by an adhesive to a 0.50 mil layer of aluminum foil. The layer of aluminum foil is laminated by an adhesive to a 3.0 rail layer of modified polypropylene.

The thermal transfer bag and the preferred methods of fabricating and filling the thermal transfer bag are described in greater detail in U.S. Pat. No. 4,997,032 (Danielson et al.), which is hereby incorporated by reference. Although the embodiment shown in FIG. 1 uses a flexible bag to form expandable compartment 16, any suitable container may be used which has at least one flexible surface to allow for expansion and contraction of expandable compartment 16.

The thermal transfer liquid 14 is preferably thermally conductive, chemically inert, essentially gas-free, and thermally stable. Thermal transfer liquid 14 has a boiling point that is at or below the operating temperature of heat source 11 such that portions of the liquid adjacent the extended heat dissipating surface 28 of thermal via 22 will vaporize when conducting heat from heat source 11. The thermal transfer liquid can be selected from the representative class of fluorinated linear, branched or cyclic alkanes, ethers, tertiary amines, and aminoethers, and mixtures thereof. Preferably, perfluorinated chemicals are used in this invention, though partially fluorinated chemicals can also be used. The perfluorinated chemicals can be straight chain, branched chain, cyclic, or a combination thereof such as alkylcycloaliphatic, and are saturated, that is, free of ethylenic, acetylenic, and aromatic unsaturation. The skeletal chain can include catenary oxygen and/or trivalent nitrogen heteroatoms providing stable links between fluorocarbon groups and not interfering with the inert character of the compound.

Examples of such liquids include $CFCl_2CFCl_2$, $C_8F_{18}$, $C_8F_{17}Br$, $C_8F_{17}Cl$, $C_5F_{11}OC_6F_{13}$, $(C_4F_9)_3N$, $[(CF_3)_2NC_2F_4]_2O$, perfluorodecalin, $C_6F_{13}C_6H_{13}$, $C_3F_7O[CF(CF_3)CF_2O]_nC_2F_5$, c-$C_8F_{16}O$, 1,3-c-$C_6F_{10}$-$(COOCH_3)_2$, $CF_3SO_2N(C_2H_5)_2$, 1,3,-$C_6H_4(CH_3)(OSO_2CF_3)$, and $C_3F_7COO$-t-$C_4H_9$.

Representative examples of suitable perfluorinated chemicals or mixtures thereof are commercially available from 3M Company as Fluorinert ® Electronic Fluids, described in 3M Company product bulletin No. 98-0211-2267-0(61)NPI, issued February, 1986, e.g. Fluorinert ® liquid FC-75, which is a mixture of $C_8F_{18}$ and c-$C_8F_{16}O$, and Fluorinert ® liquid FC-77, which has a composition like FC-75 but has a broader boiling point range. Other commercially available fluorochemicals are those available from Montedison S.p.A. as GALDEN TM Perfluorinated Fluid described in the trade bulletin "Galden TM Perfluorinated Fluids"; those from Daikin Industries, Ltd. as Demnum TM fluids described in product bulletin No. ECC-5c(003)YW issued January, 1987; those from Air Products Co, as MULTI-FLUOR TM; those from ISC, Ltd.; and those from Ashai Glass Company.

The following table gives a description of the physical properties of preferred liquids useful in this invention:

| Physical Properties | Range |
| --- | --- |
| Dielectric constant (25° C.), (1 KH$_2$) | 1.8–1.98 |
| Dielectric strength (25° C.), (2.54 mm gap) per ASTM D877-67 | 35–50 kV |
| Volume resistivity (25° C.) | $1.0 \times 10^{15}$– $8.4 \times 10^{15}$ ohm-cm |
| Thermal conductivity (25° C.) | $6.0 \times 10^{-4}$– $7.0 \times 10^{-4}$ watts/cm °C. |
| Density (25° C.) per ASTM D941-55 | 1.73–2.03 g/cm$^3$ |
| Kinematic viscosity (25° C.) per ASTM D445-74 | 0.55–14 cs |
| Vapor pressure (25° C.) | <0.1–700 torr |
| Boiling point (760 torr) (Selected by desired operating temperature) | 30–100° C. |
| Coefficient of expansion | $7.5 \times 10^{-4}$– $1.5 \times 10^{-3}$ cm$^3$/(cm$^3$) (°C.) |

As mentioned above, the thermal transfer liquid 14 is preferably essentially gas-free. One method of purging gas from liquid 14 prior to sealing the bag comprises heating the liquid in a vessel until the temperature of the liquid is sufficiently high to expel air from the liquid and holding the liquid at this temperature until the air is expelled from the liquid. While the liquid is still hot, the bag is filled, remaining gas bubbles are displaced from the bag, and the bag is sealed.

Another method of expelling gas from the liquid comprises bubbling or sparging the liquid with a gas having low solubility in the liquid. Representative examples of gases having low solubilities in the thermal transfer liquid are hydrogen and preferably helium.

Figure 3:
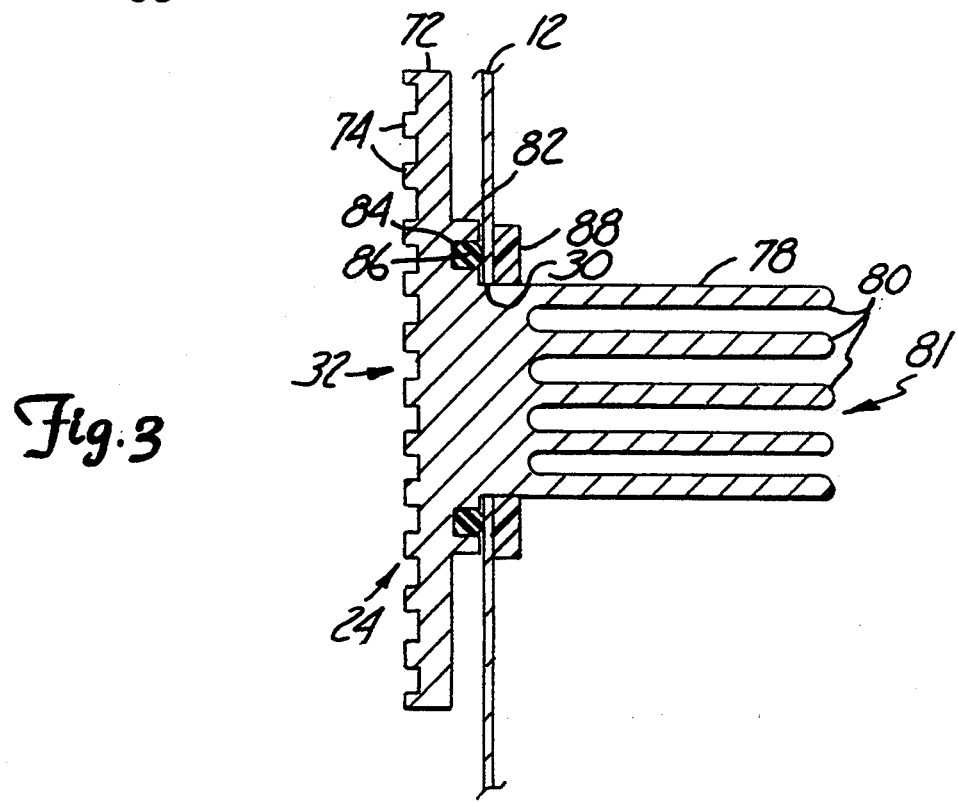
FIG. 3 is a cross sectional view of a condenser in accordance with the present invention.

Condenser 24 is shown in greater detail in FIG. 3. Condenser 24 includes a first portion 72 which extends into expandable compartment 16 at least partially within vapor reflux zone 44 and above liquid level 35. The first portion 72 includes and array of small stubs or fins 74 which provide the extended condensing surface 32 for efficient heat exchange with the vapor within vapor reflux zone 44. Condenser 24 further includes a second portion 78 which extends outward from flexible bag 12 and is in thermal communication with the first portion 72. The second portion 78 includes a plurality of fins 80 which provide an extended heat dissipating surface 81 for condenser 24.

Condenser 24 can be attached to bag 12 by any known means of attachment which sealably connects the condenser to the bag. In the embodiment shown in FIG. 3, condenser 24 is attached to bag 12 in a similar manner as thermal via 22 is attached to bag 12. Condenser 24 includes an annular flange 82 having an annular groove 84 formed adjacent to bag 12. Groove 84 receives an O-ring 86. An annular lock ring 88, together with O-ring 86, comprise a means for sealingly connecting condenser 24 to bag 12 within aperture 30. Lock ring 88 has an inner diameter slightly smaller than the outer diameter of the second portion 78 in order to establish a self-sustaining, interference fit relationship when lock ring 88 is pressed over the second portion 78. In one embodiment, lock ring 88 is made of a plastic material.

Condenser 24 increases condensation and increases the rate at which heat is dissipated to the surrounding environment. As the vapor condenses on condensing surface 32, condenser 24 conducts heat from the first portion 72 to the second portion 78 where the heat is dissipated to the surrounding environment. The heat can be dissipated by natural or forced air convection or by liquid convection.

Condenser 24 dissipates heat at a rate which is proportional to the heat flux from heat source 11. As mentioned above, condenser 24 is positioned such that condensing surface 32 is positioned at least partially within vapor reflux zone 44. As the heat flux from heat source 11 increases (FIGS. 1(b) and 1(c)), vapor space 36 expands and vapor level 38 rises along condensing surface 32 which exposes more of condensing surface 32 to the vapor and increases the rate of condensation. As the temperature of condenser 24 increases, the rate of heat transfer into the surrounding air increases. Therefore, condenser 24 efficiently transfers heat into the surrounding environment in proportion to the heat flux from heat source 11 such that expandable compartment 16 operates with minimum volume.

Although condenser 24 provides several advantages, it should be noted that condenser 24 is optional in thermal transfer apparatus 10 since the vapor also condenses on the interior surfaces of bag 12. In certain applications, condensation on the interior surfaces of bag 12 provides sufficient heat dissipation. In one embodiment (not shown), bag 12 includes one or more pleats or folds which allow greater expansion of expandable compartment 16 and provide additional surface area for condensation within compartment 16.

Figure 4:
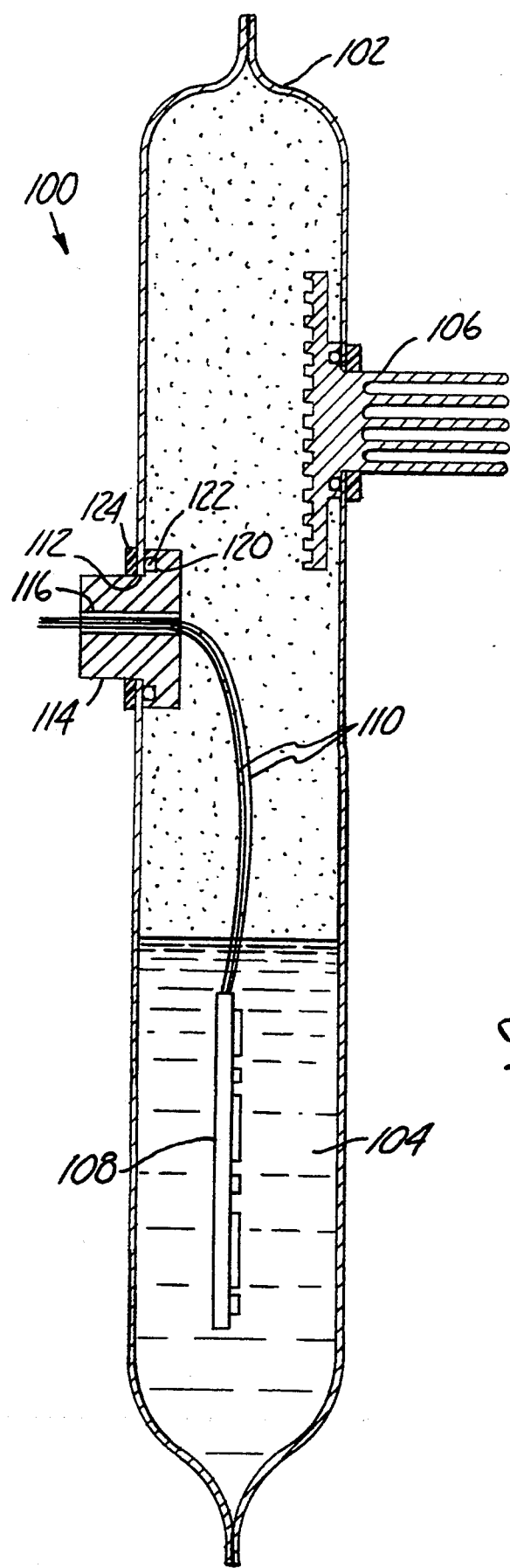
FIG. 4 is a cross sectional view of an alternative, two-phase thermal transfer apparatus in which the heat source is positioned within the bag and is submerged in a thermal transfer liquid.

FIG. 4 is a cross sectional view of an alternative, two-phase thermal transfer bag apparatus in which the heat source is positioned internal to the flexible bag and is submerged in the thermal transfer liquid. Thermal transfer apparatus 100 includes flexible bag 102, thermal transfer liquid 104 and condenser 106. Heat source 108 is positioned internal to bag 102 and is submerged in thermal transfer liquid 104. In one embodiment, heat source 108 includes a circuit board with a plurality of heat generating components.

Communication and power leads 110 extend from heat source 108 through an aperture or umbilicus 112 in bag 102. An aluminum plug 114 similar to thermal via 22 (shown in FIG. 2) and condenser 24 (shown in FIG. 3) is sealed to bag 102 within aperture 112. The aluminum plug 114 includes an aperture 116 to allow leads 110 to pass through the plug. Leads 110 can be sealed to aluminum plug 114 with quick setting epoxy. Aluminum plug 114 further includes an annular groove 120 which receives an O-ring 122. An annular lock ring 124, together with O-ring 122, comprise a means for sealingly attaching aluminum plug 114 to bag 102 in a similar manner as thermal via 22 (FIG. 2) is attached to bag 12. Although FIG. 4 illustrates an embodiment in which an aluminum plug is used to pass communication and power leads to and from heat source 108, any other method or apparatus for providing communication and power leads to heat source 108 can be used with the present invention.

Figure 5:
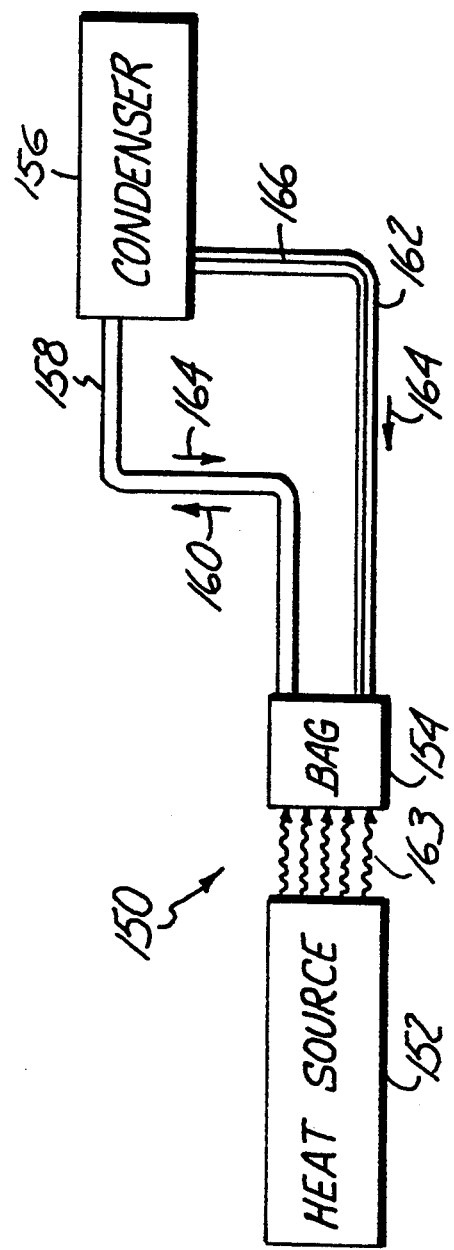
FIG. 5 is a diagrammatic view of an alternative, thermal transfer apparatus having a condenser positioned external to the bag, in accordance with the present invention.

FIG. 5 is a diagrammatic view of an embodiment in which the thermal transfer apparatus of the present invention includes a remote condenser which is positioned external to the bag and the expandable compartment. Thermal transfer apparatus 150 includes heat source 152, thermal transfer bag 154 and remote condenser 156. Remote condenser 156 is connected to thermal transfer bag 154 through tubes 158 and 162. As discussed with reference to FIGS. 1–4, thermal transfer bag 154 conducts heat 163 from heat source 152 causing the thermal transfer liquid within bag 154 to vaporize and form a vapor within the bag. The vapor travels through tube 158 in a direction indicated by arrow 160 to remote condenser 156 where the vapor condenses and forms a condensate. The condensate returns to thermal transfer bag 154 through tube 158 or through optional return tube 162 in a direction indicated by arrow 164 for additional cooling of heat source 152.

Thermal transfer apparatus 150 can further include a wick 166 extending between remote condenser 156 and the thermal transfer liquid to assist in returning the condensate to bag 154. Wick 166 allows greater flexibility in the design and use of thermal transfer apparatus 150 since gravity is no longer required to return the condensate to bag 154. For example, the wick may be used in low gravity space applications or in applications that require various physical orientations of the bag and condenser. Without wick 166, thermal transfer apparatus 150 requires condenser 156 to be positioned above the thermal transfer liquid or requires a pump (not shown) between condenser 156 and the liquid such that the condensate will return to bag 154.

The flexible, two-phase thermal transfer apparatus of the present invention is particularly useful as a heat sink for microelectronic components. The thermal transfer bag draws no additional power from the system and is efficient enough to cool high-power integrated circuits such as the Pentium TM microprocessor which is manufactured by Intel Corporation. The thermal transfer bag can simply be placed in the system housing, adjacent the integrated circuits that require cooling. The flexible nature of the bag allows the bag to conform to the interior of the housing and to act as a shock absorber for the integrated circuits. The bag provides a low-profile, efficient liquid cooling technique that can be used in smaller systems such as desktop and notebook computers.

The flexible, two-phase thermal transfer apparatus of the present invention offers important advantages over the performance of a single phase system. The operating temperature of the heat source in a two-phase system is dependent on the boiling point of the liquid that is used as a heat transfer fluid. Provided the heat flux at the heat source does not exceed the critical heat flux of the liquid, and as long as the heat supplied to the liquid is removed, the heat source operates at a fairly uniform temperature. Further, the flexible nature of the bag allows the boiling point of the liquid to remain constant, which maintains the integrated circuits at a stable operating temperature. As heat flux from the integrated circuits increases, the volume of the bag increases to maintain ambient pressure within the bag and thus maintain a constant boiling point. An added benefit of a two-phase system is that the condenser dissipates heat more efficiently than a single phase system dissipates heat. The greater the temperature difference between the heat source and the condenser, the greater the efficiency of the heat dissipation.

Although the present invention has been described with reference to preferred embodiments, workers skilled in the art will recognize that changes may be made in form and detail without departing from the spirit and scope of the invention. For example, the expandable compartment may be formed by a rigid container having at least one flexible surface or joint. In addition, the heat source can be positioned internal to the container, external to the container, or as part of the hermetic seal of the container. Various other changes can also be made without departing from the spirit and scope of the present invention.

What is claimed is:

1. A two-phase thermal transfer apparatus adapted for thermal connection to a heat source, the thermal transfer apparatus comprising:
   a flexible bag which is substantially impermeable to fluid and has at least one compartment that is expandable between a first volume and a second volume;
   a thermal transfer liquid which is thermally connected to the heat source and is positioned within the flexible bag; and
   a rigid condenser which is sealably attached to the flexible bag, has a high thermal conductivity, has an extended condensing surface positioned within the flexible bag and has an extended heat dissipating surface positioned external to the flexible bag.

2. A thermal transfer apparatus for conducting heat away from a heat source having an operating state and a non-operating state, with the heat source having an operating temperature when in the operating state, the thermal transfer apparatus comprising:
   a container which is substantially impermeable to fluid and forms at least one expandable compartment;
   a thermally conductive liquid which is positioned within the expandable compartment and is thermally connected to the heat source, wherein the liquid has a boiling point that is at or below the operating temperature of the heat source such that the liquid is compressed when the heat source is in the non-operating state and the liquid is saturated and forms a vapor as portions of the liquid vaporize when the heat source is in the operating state; and
   a condenser which is thermally connected to the vapor, has a high thermal conductivity and has an extended heat dissipating surface positioned external to the expandable compartment.

3. The thermal transfer apparatus of claim 2 wherein the container comprises a flexible bag made of a multilayer, heat-sealable, thermoplastic film.

4. The thermal transfer apparatus of claim 2 wherein the expandable compartment comprises at least one flexible surface which allows expansion and contraction of the expandable compartment.

5. The thermal transfer apparatus of claim 2 wherein the expandable compartment is expandable and contractible between a first volume and a second volume in response to changes in heat conducted from the heat source such that the expandable compartment maintains the liquid at approximately ambient pressure substantially independent of changes in heat conducted from the heat source.

6. The thermal transfer apparatus of claim 2 wherein the liquid comprises a fluorochemical liquid.

7. The thermal transfer apparatus of claim 2 and further comprising:
   a thermal via extending through an aperture in the container and sealably connected to the container, the thermal via having a first portion which is positioned external to the container for thermal connection to the heat source and having a second portion which is positioned internal to the container and is submerged in the liquid for thermal communication with the liquid.

8. The thermal transfer apparatus of claim 2 and further comprising:
   power and communication leads connected to the heat source and extending from the heat source through an aperture in the container, with the aperture being sealed about the power and communication leads; and
   wherein the heat source is positioned within the container and is submerged in the liquid.

9. The thermal transfer apparatus of claim 2 wherein the condenser is attached to and in thermal communication with the container.

10. The thermal transfer apparatus of claim 2 wherein the condenser is positioned external to the container and is coupled to the container such that the condenser is in communication with the vapor.

11. The thermal transfer apparatus of claim 2 and further comprising:
   a vapor reflux zone which is located within the expandable compartment; and
   wherein the condenser comprises an interior condensing surface which is located at least partially within the vapor reflux zone.

12. The thermal transfer apparatus of claim 2 and further comprising:
   a vapor reflux zone which is located within the expandable compartment; and
   wherein the condenser extends through an aperture in the container and is sealably connected to the container, the condenser having a condensing surface which is positioned at least partially within the vapor reflux zone and at least partially above the liquid wherein the condensing surface is thermally connected to the heat dissipating surface.

13. The thermal transfer apparatus of claim 12 wherein the condensing surface comprises a plurality of fins which provide an extended condensing surface.

14. The thermal transfer apparatus of claim 12 wherein the condensing surface is positioned within the expandable compartment such that the condensing surface becomes increasingly exposed to the vapor as the heat conducted from the heat source increases and causes the vapor reflux zone to expand.

15. The thermal transfer apparatus of claim 2 and further comprising a wick extending between the condenser and the liquid.

16. The thermal transfer apparatus of claim 2 wherein the extended heat dissipating surface comprises a plurality of fins.

17. A two-phase thermal transfer apparatus adapted for thermal connection to a heat source which has an operating state and a non-operating state, with the heat source having an operating temperature when in the operating state, the thermal transfer apparatus comprising:
   a flexible bag which is substantially impermeable to fluid and has at least one compartment that is expandable between a first volume and a second volume;
   a thermal transfer liquid which is thermally connected to the heat source and has a boiling point that is at or below the operating temperature of the heat source, wherein the thermal transfer liquid is compressed and substantially fills the first volume when the heat source is in the non-operating state and wherein the thermal transfer liquid is saturated and forms a vapor when the heat source is in the operating state; and a rigid condenser which is thermally connected to the vapor, has a high thermal conductivity and has an extended heat dissipating surface positioned external to the compartment.

18. The two-phase thermal transfer apparatus of claim 17 and further comprising:

a thermal via extending through an aperture in the flexible bag and sealably connected to the flexible bag, the thermal via having a first portion which is positioned external to the flexible bag for thermal connection to the heat source and having a second portion which is positioned internal to the flexible bag and is submerged in the thermal transfer liquid for thermal communication with the thermal transfer liquid.

19. The two-phase thermal transfer apparatus of claim 17 and further comprising:

power and communication leads connected to the heat source and extending from the heat source through an aperture in the flexible bag, with the aperture being sealed about the power and communication leads; and wherein the heat source is positioned within the flexible bag and is submerged in the thermal transfer liquid.

20. The two-phase thermal transfer apparatus of claim 17 wherein the condenser is positioned external to the flexible bag and is coupled to the flexible bag such that the condenser is in communication with the vapor.

21. The two-phase thermal transfer apparatus of claim 17 and further comprising:

a vapor reflux zone which is located within the expandable compartment; and wherein the condenser extends through an aperture in the flexible bag and is sealably connected to the flexible bag, the condenser having a condensing surface which is positioned at least partially within the vapor reflux zone and at least partially above the thermal transfer liquid, wherein the condensing surface is thermally connected to the heat dissipating surface.

22. The two-phase thermal transfer apparatus of claim 17 and further comprising a wick extending between the condenser and the thermal transfer liquid.

23. A two-phase thermal transfer apparatus adapted to conduct heat away from a heat source which has an operating state and a non-operating state, the thermal transfer apparatus comprising:

a container which is substantially impermeable to fluid and forms at least one expandable compartment which is expandable and contractible between a first volume and a second volume in response to heat flux from the heat source to maintain an internal pressure within the expandable compartment at substantially ambient pressure;

a thermally conductive liquid which is positioned within the expandable compartment and is thermally connected to the heat source, wherein the liquid has chemical properties that are selected such that:

when the heat source is in the non-operating state, the expandable compartment has the first volume and the liquid is compressed and substantially fills the first volume; and when the heat source is in the operating state, the liquid saturates and portions of the liquid vaporize forming a vapor which causes the expandable compartment to expand from the first volume toward the second volume and create a vapor space located above the liquid within the expandable compartment; and a condenser which is thermally connected to the vapor, has a high thermal conductivity, and has an extended heat dissipating surface.

24. A thermal transfer apparatus comprising:

an electronic device to be maintained in an operating and a non-operating state, wherein the electronic device has an operating temperature when the electronic device is in the operating state;

a flexible thermal transfer bag which is substantially impermeable to fluid and forms at least one expandable compartment which is expandable and contractible between a first volume and a second volume;

a two-phase thermal transfer liquid which is positioned within the expandable compartment and is thermally connected to the electronic device, wherein the liquid has a boiling point that is at or below the operating temperature of the electronic device such that when the electronic device is in the non-operating state, the liquid is compressed and substantially fills the first volume and when the electronic device is in the operating state, the liquid saturates and portions of the liquid vaporize forming a vapor which causes the expandable compartment to expand from the first volume toward the second volume and create a vapor space located above the liquid within the expandable compartment; and a condenser which is attached to the flexible bag, is thermally connected to the vapor and has an extended heat dissipating surface positioned external to the expandable compartment.

25. A two-phase thermal transfer apparatus adapted for thermal connection to a heat source which has an operating state and a non-operating state, with the heat source having an operating temperature when in the operating state, the thermal transfer apparatus comprising:

a thermal transfer liquid which is thermally connected to the heat source and has a boiling point that is at or below the operating temperature of the heat source;

container means which is expandable between a first volume and a second volume for holding the thermal transfer liquid at ambient pressure, for maintaining the thermal transfer liquid in a compressed state when the heat source is in the non-operating state, and for maintaining the thermal transfer liquid in a saturated state when the heat source is in the operating state such that portions of the thermal transfer liquid vaporize and form a vapor which causes the container to expand from the first volume toward the second volume;

means for condensing the vapor into a condensate at a location remote from the heat source; and means for dissipating heat, which is thermally connected to the means for condensing and which has a rigid, extended heat dissipating surface for dissipating heat at a rate sufficient to maintain the thermal transfer liquid at ambient pressure and the container means at a minimum volume between the first volume and the second volume.

* * * * *